(12) United States Patent
O'Brien et al.

(10) Patent No.: US 12,210,039 B2
(45) Date of Patent: Jan. 28, 2025

(54) MULTI-MODE MEASUREMENT PROBE

(71) Applicant: Tektronix, Inc., Beaverton, OR (US)

(72) Inventors: Joshua J. O'Brien, Aloha, OR (US); Josiah A. Bartlett, Forest Grove, OR (US)

(73) Assignee: Tektronix, Inc., Beaverton, OH (US)

( * ) Notice: Subject to any disclaimer, the term of this patent is extended or adjusted under 35 U.S.C. 154(b) by 0 days.

(21) Appl. No.: 17/721,294

(22) Filed: Apr. 14, 2022

(65) Prior Publication Data
US 2022/0334144 A1 Oct. 20, 2022

Related U.S. Application Data

(60) Provisional application No. 63/176,041, filed on Apr. 16, 2021.

(51) Int. Cl.
  *G01R 1/067* (2006.01)
  *G01R 1/10* (2006.01)
  *G01R 31/10* (2006.01)

(52) U.S. Cl.
  CPC ..... *G01R 1/06766* (2013.01); *G01R 1/06772* (2013.01); *G01R 1/06788* (2013.01)

(58) Field of Classification Search
  CPC ........ G01R 31/002; H05K 2201/10689; H01L 22/14
  See application file for complete search history.

(56) References Cited

U.S. PATENT DOCUMENTS

| | | | | |
|---|---|---|---|---|
| 2005/0237079 | A1* | 10/2005 | Tanida | G01R 31/2844 324/762.01 |
| 2006/0033510 | A1* | 2/2006 | Kazama | G01R 31/315 324/750.16 |
| 2008/0029762 | A1* | 2/2008 | Schroeder | H01L 22/14 257/48 |
| 2009/0134880 | A1* | 5/2009 | Grund | G01R 31/002 324/537 |
| 2009/0273358 | A1* | 11/2009 | Arkin | G01R 1/07307 324/756.03 |
| 2012/0179410 | A1* | 7/2012 | Montrose | G01R 31/2621 324/762.05 |
| 2013/0285629 | A1* | 10/2013 | Sobolewski | G01R 1/36 323/273 |

(Continued)

*Primary Examiner* — Jermele M Hollington
*Assistant Examiner* — Temilade S Rhodes-Vivour
(74) *Attorney, Agent, or Firm* — Miller Nash LLP; Andrew J. Harrington

(57) ABSTRACT

A measurement probe for producing a test signal for a measurement instrument includes a probe head structured to be connected to at least a first testing point and a second testing point of a Device Under Test (DUT), a current detector in the measurement probe structured to determine a current flowing between the first testing point and the second testing point of the DUT, a first selectable signal path that causes a voltage signal from the first testing point or a voltage signal from the second testing point to be routed to the measurement instrument as a selected voltage test signal, and a second selectable signal path that causes a current signal from an output of the current detector to be routed to the measurement instrument as a selected current test signal. Methods of testing a DUT using the measurement probe are also described, as well as a system for measuring signals from a DUT using the measurement probe.

20 Claims, 5 Drawing Sheets

(56) References Cited

U.S. PATENT DOCUMENTS

| | | | |
|---|---|---|---|
| 2019/0162765 A1* | 5/2019 | Steuer | G01R 1/06788 |
| 2020/0150153 A1* | 5/2020 | Zimmerman | G01R 19/0038 |
| 2021/0063440 A1* | 3/2021 | Swaim | G01R 19/25 |

* cited by examiner

MULTI-MODE MEASUREMENT PROBE

CROSS-REFERENCE TO RELATED APPLICATIONS

This disclosure is a non-provisional of and claims benefit from U.S. Provisional Patent Application No. 63/176,041, titled "TRI-MODE POWER PROBE," filed Apr. 16, 2021, the disclosure of which is incorporated herein by reference in its entirety.

TECHNICAL FIELD

This disclosure relates to test and measurement systems, and more particularly to a test and measurement probe for use in a test and measurement system.

BACKGROUND

Measurement probes are used in conjunction with a test-and-measurement instrument to probe, or select, particular portions of a Device Under Test (DUT) for measurement. For instance, a user may touch a voltage probe tip of a measurement probe to various contact points on a development board of a DUT to measure the voltage at those points. Manipulating a measurement test probe by hand is adequate for measuring some signals, such as Direct Current (DC) voltages or low frequency signals, but measuring other signals may be enhanced by soldering a probe tip directly to a test point on the DUT, ensuring good electrical contact between the DUT and the test probe, which increases measurement accuracy.

Single-ended measurements measure signal properties in reference to ground, while a differential measurement is one made between two signal lines or test points of a DUT. A voltage measured at a source or load is a single-ended measurement, while a measurement that simultaneously measures a voltage difference between the source and the load is a differential measurement. Probes are also used to measure electrical current passing through the load. Presently, measuring both voltage and current of a test point in a DUT requires soldering multiple probe tips to the DUT— one for current, and one or two for voltage, depending on whether the voltage measurement is single-ended or differential. If the test system has only a single probe, then the probe is moved between the test points. To make simultaneous measurements, two probes are needed. Requiring multiple probes increases the costs of a testing system, while moving probes during a testing sequence increases the time needed to perform the tests.

Embodiments of the disclosure address these and other limitations in existing test systems.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure include a multi-mode measurement probe for acquiring a test signal from a Device Under Test (DUT) and producing any of a number of different test signals for a measurement device. The different measurements may be made without the need to move or reposition the connections between the probe tip and the DUT. As described below, a user may measure voltage, current, or power, by selecting the appropriate mode. Including the power mode in the measurement probe allows a connected test and measurement instrument to generate a triggering event based on a power threshold, or satisfying a predefined condition that includes a power component.

Figure 1:
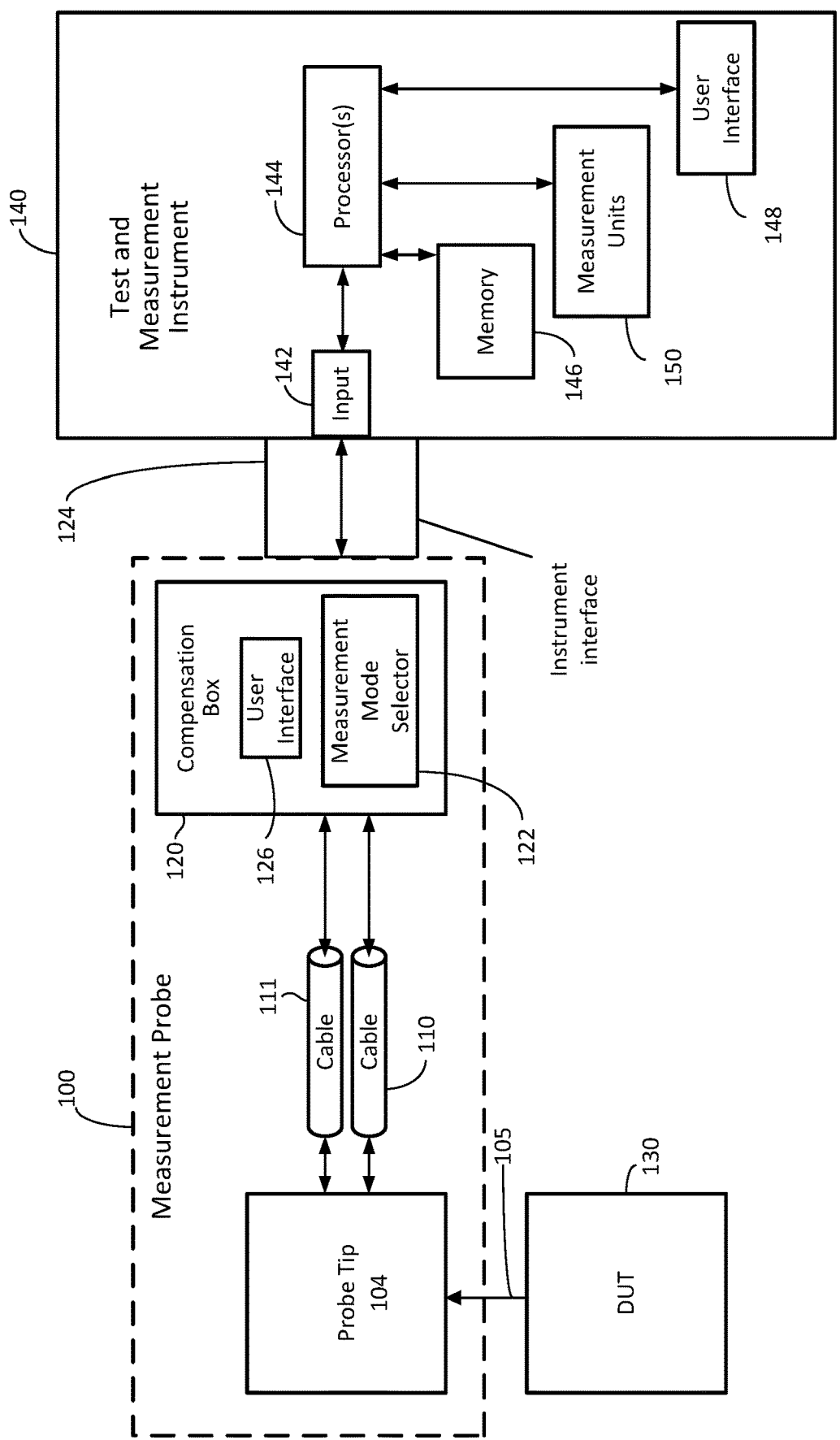
FIG. 1 is a functional block diagram illustrating a measurement system including a measurement probe having multiple selectable measurement modes according to embodiments of the disclosure.

FIG. 1 is a functional block diagram showing portions of a configuration for a multi-mode test and measurement probe 100 according to embodiments. In FIG. 1, the measurement probe 100 is connected between a test and measurement instrument 140 and a device under test (DUT) 130. As illustrated in FIG. 1, the measurement probe 100 generally includes a probe tip 104, one or more probe cables 110, 111, and a compensation box 120.

As described above, the probe tip 104 is the part of the measurement probe 100 that physically connects the measurement probe 100 to the DUT 130 and obtains a signal 105 from the DUT 130 to be analyzed. Further details of the probe tip 104 are described below. The probe cables 110, 111 are typically of some length, generally one meter or more, and conduct the signal 105 acquired from the DUT 130 between the probe tip 104 and the compensation box 120.

The compensation box 120 is the part of the measurement probe 100 that connects to the instrument 140, generally through an instrument interface 124. The instrument interface 124 may include mechanical and electrical connections to mechanically and electrically connect the probe 100 to the instrument 140. The compensation box 120, or "compbox" is a standard term in the test-and-measurement industry, and refers to the electronic circuits or components between the probe cables 110, 111 and the instrument interface 124, which are oftentimes contained in a housing, or box. Circuits or devices within the compensation box 120 may be used to compensate for various electrical properties of the probe tip 104 and/or cables 110, 111. The compensation box 120 also includes a measurement mode selector 122, through which the user can select a variety of various measurement modes, as described below. The compensation box 120 communicates with the instrument 140 through the instrument interface 124. In some embodiments the instrument interface uses I²C communications, while in other embodiments the communications are made through communications on a data bus, for example a Universal Serial Bus (USB). Other communication methods for the instrument interface 124 are possible as well. As described below, a user may control operation of the measurement probe 100, including the measurement mode selector 122, through either or both of the measurement probe 100 and the instrument 140.

The compensation box 120 may include a user interface 126, such as in the form of buttons or lights, or both, that allow a user to monitor and control settings or functions of the measurement probe 100 or the test and measurement instrument 140. For example, the user interface 126 may have a menu button which, when pressed by a user, brings up menu options on the instrument 140 that allow the user to set various modes of the measurement probe. Or, pressing a button on the user interface 126 may cause a particular selection to be indicated, such as by illuminating a light next to the selected option. Alternatively, as described below, a user may control the operation of the measurement probe 100, including the measurement mode selector 122 using a user interface of the instrument 140.

The instrument 140 may be any type of test instrument that connects to a measurement probe, such as an oscilloscope. The instrument 140 includes one or more inputs 142, which may be any electrical signaling medium and may act as a testing interface to accept the signal for measuring or testing from the measurement probe 100. The input 142 may be separated by channels, where each channel is structured to receive a separate signal for measuring or testing, and where the instrument 140 is structured to manage each channel independently, or combine channels as directed by the user.

Instrument 140 includes one or more processors 144. Although only one processor 144 is shown in FIG. 1 for ease of illustration, as will be understood by one skilled in the art, multiple processors of varying types may be used in combination, rather than a single processor 144. The one or more processors 144 operate in conjunction with memory 146, which may store instructions for controlling the one or more processors, or data related to the measurement of the test signal or general operation of the instrument 140, or other data. The memory 146 may be implemented as processor cache, random access memory (RAM), read only memory (ROM), solid state memory, hard disk drive(s), or any other memory type.

A user interface 148 for receiving input from the user and sending output to the user is coupled to or integrated into the instrument 140. The user interface 148 may include a keyboard, mouse, touchscreen, and/or any other controls employable by a user to interact with the instrument 140. A display/output portion of the user interface 148 may be a touchscreen display, accepting both user input and providing instrument output. Or, the display/output may be an output only display, which operates in conjunction with the user interface 148. The display/output of the user interface 148 may be a digital screen, computer monitor, or any other monitor to display test results or other results to a user as discussed herein. The user interface 148 may also include one or more data outputs that may or may not be correlated with a visual display. The data outputs from the user interface 148 could be sent to a data network, such as a local area network, which may be coupled to a host computer for viewing the data. The user interface 148 may also send data to a remote network, such as a cloud network accessible over the internet by a host computer. While the components of the instrument 140 are depicted as being integrated with instrument 140, it will be appreciated by a person of ordinary skill in the art that any of these components can be external to instrument 140 and can be coupled to test instrument 140 in any conventional manner, such as wired and/or wireless communication media and/or other mechanisms.

The instrument 140 may generally include one or more measurement units 150. Such a measurement unit includes any component capable of measuring aspects (e.g., voltage, amperage, amplitude, etc.) of a signal received via the input 142. The instrument 140 may also include additional hardware and/or processors, such as conditioning circuits, an analog to digital converter, and/or other circuitry to convert a received signal to a waveform for processing as generally used to process an input received from the measurement probe 100. While particular components of the instrument 140 are depicted in FIG. 1, many additional components may be present in the instrument depending on the type and quality of signal being tested from the DUT.

Figure 2:
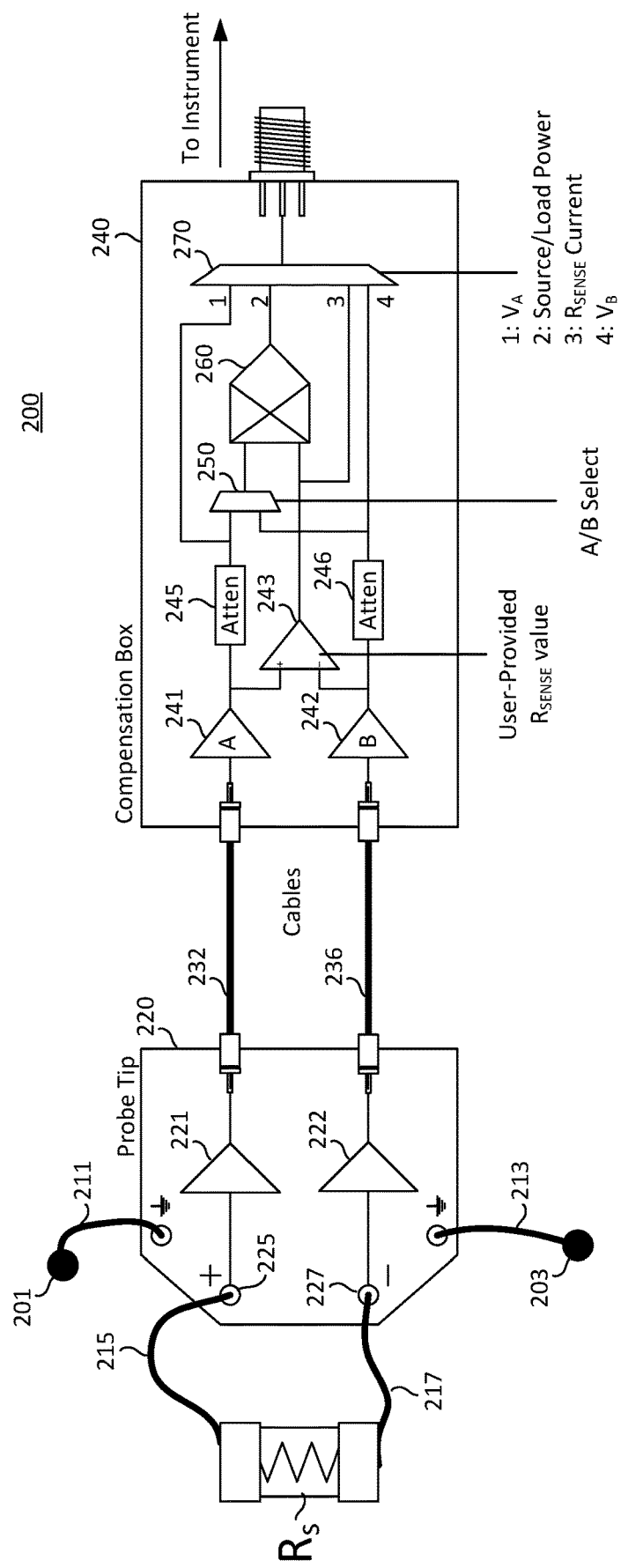
FIG. 2 is a functional block diagram illustrating an example measurement probe of FIG. 1, according to embodiments of the disclosure.

FIG. 2 is a functional block diagram illustrating a measurement probe 200 having multiple modes that are selectable by a user, according to embodiments of the invention. Like measurement probe 100, measurement probe 200 includes a probe tip 220 for connecting to one or more test points of a DUT. In FIG. 2, a sense resistor $R_S$ represents a load being tested in the DUT (not illustrated in FIG. 2). The sense resistor $R_S$ may also represent a current shunt for measuring current in the DUT, as described below. The probe tip includes a first lead 215 coupled from a first connection point 225 to a first side of the sense resistor, while a second lead 217 is coupled from a second connection point 227 to a second side of the sense resistor. The first side, coupled to the lead 215, is referred to herein as the source side, (+), or $V_A$, and assume it is connected to a source voltage in the DUT. The second side, coupled to the lead 217, is referred to herein as the load side, (−), or $V_B$, and assume it is coupled to the load being tested in the DUT. The probe tip 220 also includes two ground leads 211, 213, which are coupled to ground nodes 201, 203 of the DUT, respectively. Generally, the leads 211, 213, 215, 217 are soldered in place in the DUT, to ensure a good electrical connection to the measurement probe 200.

At the probe tip 220 is an amplifier 221 structured to amplify a voltage signal $V_A$ from the source side of the sense resistor $R_S$ before being sent to a cable 232. Similarly, an amplifier 222 is structured to amplify a voltage signal $V_B$ from the load side of the sense resistor $R_S$ before being sent to a cable 236. The amplifiers 221, 222 may be rated for 12-48 volts, and bandwidths of 1 GHz-8 GHz, for example, but could vary depending on the measured parameters of the DUT. Depending on the implementation, the probe tip 220 may include other signal conditioning circuitry not illustrated in FIG. 2. For some testing environments, the amplifiers 221, 222 are configured as attenuators, rather than amplifiers, and are structured to reduce the amplitude of the sensed signals before passing it to the cables 232, 236.

The cables 232, 236 carry the amplified voltage signals $V_A$ and $V_B$ from the probe tip 220 of the measurement probe 200 to a compensation box 240. The cables 232, 236 may each be shielded co-axial cables that carry their respective voltage signal $V_A$, $V_B$ and the ground reference from nodes 201 and 203. In some embodiments only one ground lead 211 or 213 is used by the probe tip 220, and the ground reference is passed to both cables 232, 236 from a single ground node. Typical measurement probes are either single-ended probes, measuring voltage from either the source or the load, or are differential probes, measuring a voltage difference between the source and the load. Embodiments of the invention, however, such as measurement probe 200 of FIG. 2, carry the source and load voltages independently. By keeping the source and load voltages separated, circuits within the compensation box can perform measurement operations on the sensed voltage signals, and can be controlled by a user to select one of several different signals for sending to a measurement instrument, as described in detail below. Specifically, outputs of the measurement probe 200 can provide signals representing the source voltage $V_A$, the load voltage $V_B$, the current through the sense resistor, and the power being provided to or received from the load of the DUT. Although the circuits and mode selector are illustrated as being within the compensation box, in other embodiments these circuits may appear anywhere within the measurement probe 200, and are not required to be contained within the compensation box.

Selection of which measurement is the active output of the multi-mode current probe 200 is made by controlling a multiplexer 270, the output of which is fed to a measurement instrument, such as the instrument 140 of FIG. 1. The user controls the multiplexer 270 by sending a control signal to the multiplexer 270 as described above, by either pressing a button or an element on a user interface on the compensation box, such as user interface 126 of FIG. 1, or by making selection on the instrument 140, which is communicated back to the current probe through an instrument interface, such as the interface 124 of FIG. 1. There may be other ways of selecting the output of the multiplexer 270 as well.

Selecting option (1) of the multiplexer 270 selects the source voltage $V_A$ as the output of the multi-mode measurement probe 200. Similarly, selecting option (4) of the multiplexer 270 selects the load voltage $V_B$ as the output of the measurement probe 200. Tracing the flow into option (1) of the multiplexer 270 shows that the source voltage $V_A$ is processed by an amplifier 241 as well as an attenuator 245 before being provided to the multiplexer 270. In other embodiments, the source voltage $V_A$ may be selected anywhere along the path between when it enters the compensation box 240 and when it exits the attenuator 245, depending on what level of amplification, or attenuation, is desired to be presented to the instrument as the output of the measurement probe 200. Generally, a voltage, such as source voltage $V_A$, does not need as much gain, or amplification in a measurement probe to be readily sensed by the instrument, as compared to current, which tends to need substantial amplification before sending to the instrument for measurement.

A differential amplifier 243 is configured to determine the amount of current flowing through the sense resistor $R_S$ by the relationship between current and voltage illustrated in Equation 1:

$$I_{RS}=(V_A-V_B)/R_{SENSE}, \text{ where:} \qquad \text{Eq: (1)}$$

$(V_A-V_B)$=instantaneous voltage difference between source and load; and $R_{SENSE}$=resistance value of sense resistor $R_S$ As mentioned above, measuring current in a circuit typically requires more gain than measuring voltages in the circuit, as the value of sense resistor $R_S$ may be very small. Therefore, to compensate for the small resistance value, the source voltage $V_A$ and load voltage $V_B$ are amplified through amplifiers 241, 242 before being provided to the inverting differential amplifier 243. The inverting differential amplifier 243 implements the division function of Equation (1). The amount of gain required by the amplifiers 241, 242 may be implementation specific. In some embodiments the amplifiers 241, 242 may be modeled similar to a Digital to Analog Converter (DAC), and operate as a variable gain attenuator. According to Equation (1) above, other than the instantaneous voltage difference between the source and load, the only other variable used by the inverting differential amplifier 243 is the value for $R_{SENSE}$, which is the resistance value of sense resistor $R_S$ used by the DUT. Since the user knows what size sense resistor $R_S$ is used by the DUT, embodiments of the invention accept the value to use for sense resistor $R_S$ from the user, as illustrated in FIG. 2. This value may be communicated to the measurement probe 200 during setup, or at a later time using one of the user interfaces described above. Then, after receiving the value for the sense resistor $R_S$, the differential amplifier 243 uses the voltage difference information from the outputs of amplifiers 241, 242, and the resistance information from the user, to generate the instantaneous current value $I_{RS}$ at the output of the differential amplifier 243. With reference back to FIG. 2, the instantaneous current value $I_{RS}$ may be selected as the output of the measurement probe 200 by selecting option (3) of the multiplexer 270, and it is also provided to a multiplier 260, as described below.

The multiplier 260 component of the measurement probe 200 may be used to determine instantaneous power consumed or provided by the load of the DUT. The relationship of electrical power to electrical current in an electrical circuit is illustrated in Equations 2:

$$P_S=\text{Power at source}=V_A*((V_A-V_B)/R_{SENSE}) \qquad \text{Eq: (2a)}$$

$$P_L=\text{Power at load}=V_B*((V_A-V_B)/R_{SENSE}) \qquad \text{Eq: (2b)}$$

These equations can be simplified given Eq (1) above, to:

$$\text{Power at source}=V_A*I_{RS} \qquad \text{Eq: (3a)}$$

$$\text{Power at load}=V_B*I_{RS} \qquad \text{Eq: (3b)}$$

From above description, it was determined that $I_{RS}$ is the output of the differential amplifier 243. Therefore, to determine the power at the source according to Eq 3a, the voltage $V_A$ is multiplied by the output of the differential amplifier 243 in the multiplier 260. And, to determine the power at the load according to Eq 3b, the voltage $V_B$ is multiplied by the output of the differential amplifier 243. Recall, though, that amplifiers 241, 242 amplified the voltage signals $V_A$ and $V_B$ before being supplied to the differential amplifier 243. These amplified voltage signals are therefore attenuated by attenuators 245, 246, before being supplied to a selection multiplexer 250.

The selection multiplexer 250 may be controlled by the user to determine which power measurement, either at the source or at the load, is desired to be the output of the measurement probe 200 and sent to the instrument by selecting option (2) of the multiplexer 270. By selecting $V_A$, the output of the attenuator 245, to be passed from the multiplexor 250 to the multiplier 260, the user causes the output of the multiplier 260 to represent the Power at the source, from Equation (3a). By selecting $V_B$, the output of the attenuator 246, to be passed from the multiplexor 250 to the multiplier 260, the user causes the output of the multiplier 260 to represent the Power at the load, from Equation (3b). A difference between the power at the source and the power at the load indicates how much power is lost by the sense resistor $R_S$. The multiplier 260 may be configured as a Gilbert multiplier or other multiplier known to multiply analog signals.

As described above, the amplifiers 241, 242 may take different forms depending on the type of DUT being tested. For example, high voltage DUTs have different relative gain levels than those DUTS operating on lower voltage. Similarly, the attenuators 245, 246, may also be implementation specific. In one embodiment a signal level attenuated by the attenuators 245, 246 is controllable by the user, either during system set-up or while measurements are being taken. In one embodiment the attenuators 245, 246 may be implemented by adding variable levels of resistance to the received signal. In some embodiments the attenuators 245, 246, may be a switchable resistance structure.

Although the measurement probe 200 of FIG. 2 is illustrated as providing only a single measurement output to the instrument, i.e., the output of the multiplexer 270, embodiments of the invention could output any or all of the measurements described above simultaneously to the instrument on different channels. For instance, the measurement probe 200 could output the source voltage $V_A$ on Channel 1 while simultaneously outputting the instantaneous current $I_{RS}$ on Channel 2. With two additional channels available in the instrument, the load voltage $V_B$ could be output on Channel 3 and either of the Power Levels, $P_L$ or $P_S$ could be output on Channel 4.

As described above, embodiments of the invention allow for any of the above-described testing signals to be selected by the measurement probe 200 without any necessity to change any probe tip connections at the DUT. In other words, voltage measurements, current measurements, and power measurements may be made on a DUT without any necessity for multiple probes or needing to change probe connections to other testing points of the DUT.

Figure 3:
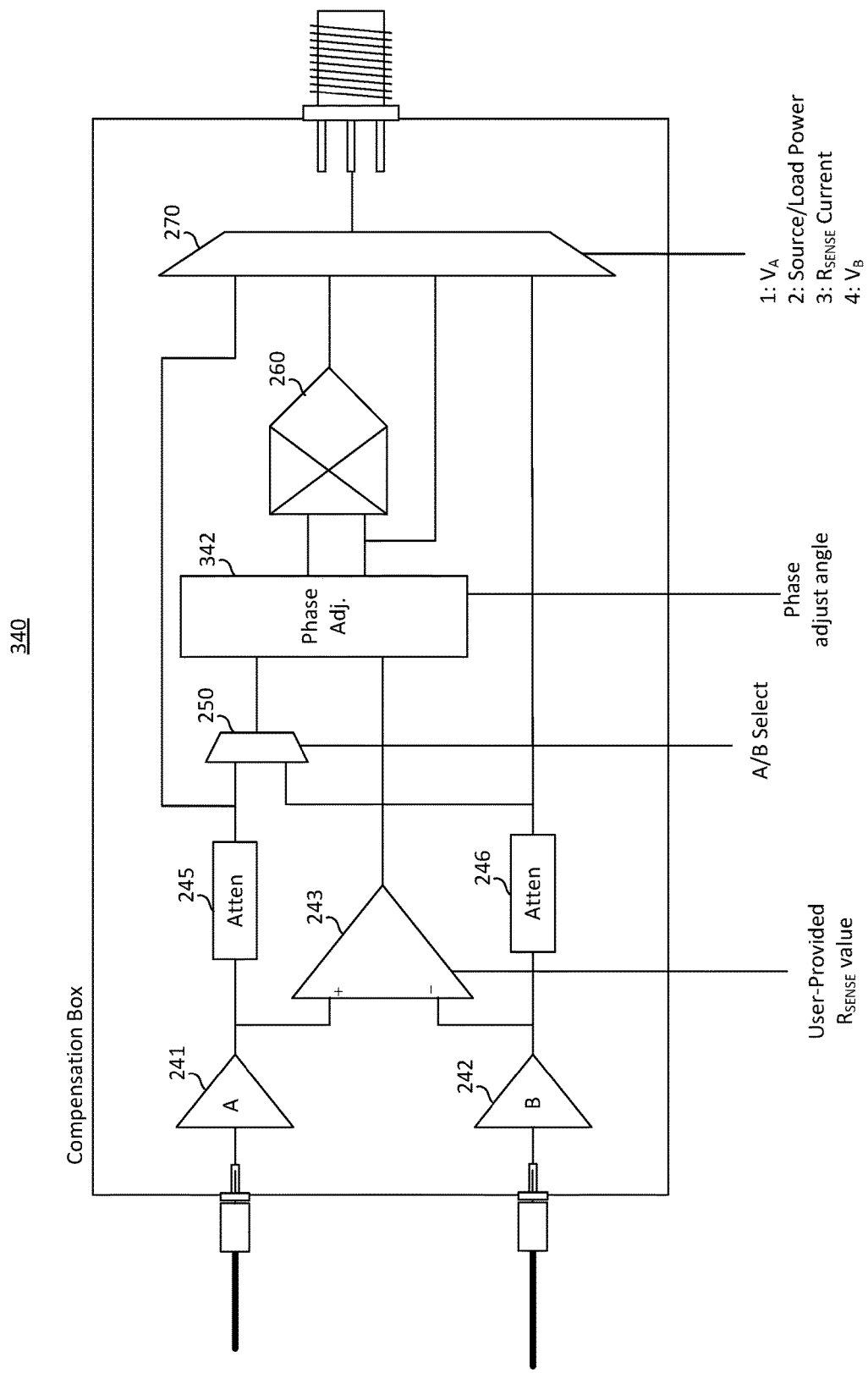
FIG. 3 is a functional block diagram of components of a measurement probe including a phase adjustment, according to embodiments of the invention.

FIG. 3 is a functional block diagram of components of a measurement probe including a phase adjustment, according to embodiments of the invention. Specifically, components of a compensation box 340 are similar to the compensation box 240 of FIG. 2, and the description of the same or similar components is omitted for brevity. The compensation box 340 may be used in conjunction with other elements of a measurement probe described above. The primary difference between the compensation box 340 of FIG. 3 and the compensation box 240 illustrated in FIG. 2 is the presence of a phase adjust component 342. The phase adjust component 342 may be present in some measurement probes to adjust the phase of the voltage output from the multiplexor 250 to the current output from the differential amplifier 243 before being combined in the multiplier 260. Depending on the circuit, current may lead or lag the voltage. The phase adjust component 342 compensates for the difference in phase and aligns the current and voltage signals before passing them to the multiplier 260. Aligning the current with the voltage increases the accuracy of the power measurement at the output of the multiplier 260. As illustrated in FIG. 3, the angle of phase adjustment may be provided by the user, using methods described above. In other embodiments, the phase angle adjustment used by the phase adjust component 342 may be determined during manufacturing through a calibration process using a known source.

Figure 4:
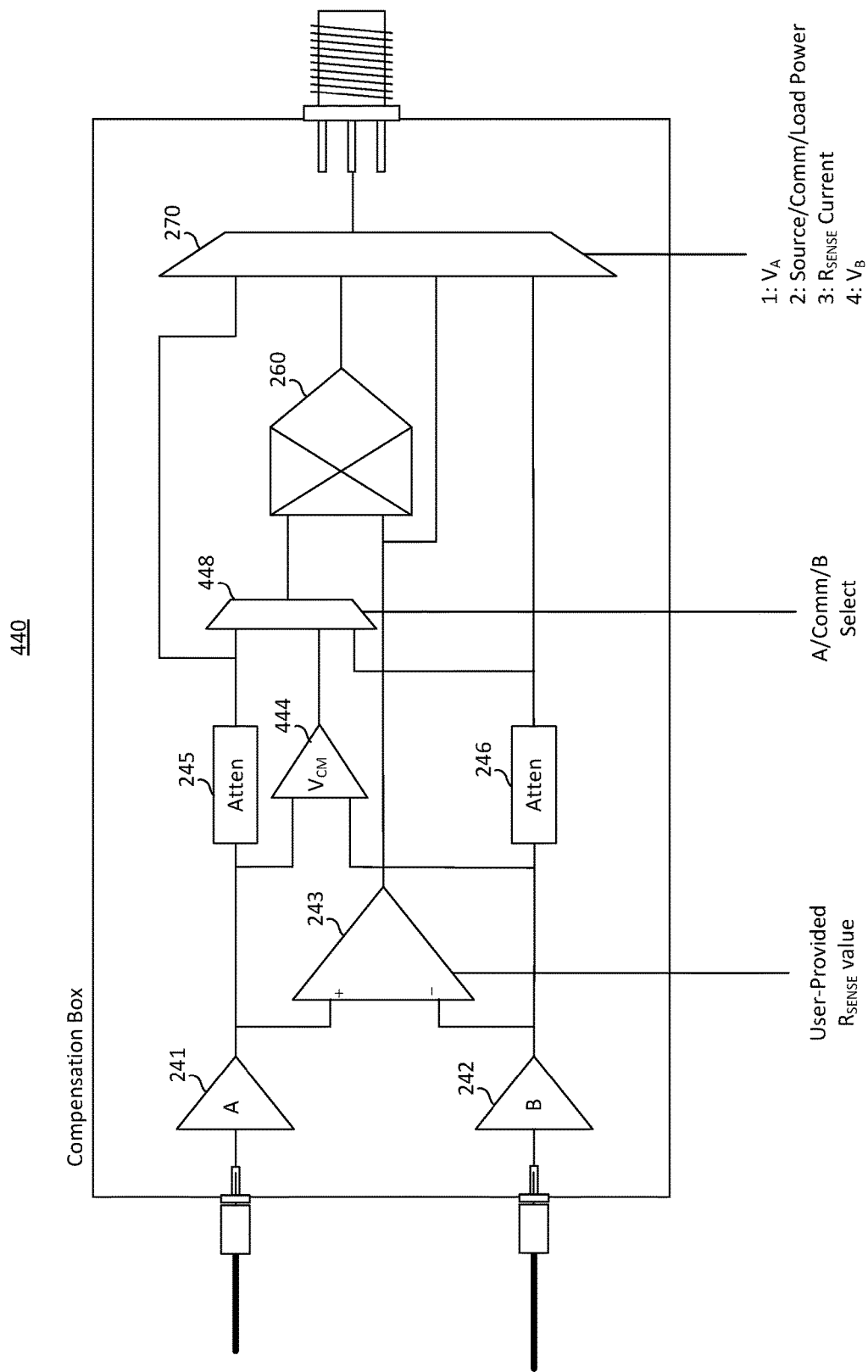
FIG. 4 is a functional block diagram of components of a measurement probe including common mode measurements, in addition to other measurements, according to embodiments of the invention.

FIG. 4 is a functional block diagram of components of a measurement probe that includes the ability to make common mode measurements, in addition to other measurements, according to embodiments of the invention. As illustrated in FIG. 4, components of a compensation box 440 are similar to components of the compensation box 240 of FIG. 2, and the description of the same or similar components is omitted for brevity. The compensation box 440 may be used in conjunction with other elements of a measurement probe described above. The primary difference between the compensation box 440 of FIG. 4 and the compensation box 240 illustrated in FIG. 2 is the presence of a common mode voltage component 444. In the embodiment illustrated in FIG. 4, a common mode voltage between the source voltage $V_A$ and the load voltage $V_B$ is defined to be as illustrated in Equation (4):

$$V_{CM}=(V_A+V_B)/2 \qquad \text{Eq: (4):}$$

The common mode voltage component 444 performs the function of Equation 4 and provides the common mode voltage $V_{CM}$ at its output. Inputs to the common mode voltage component 444 may be from either side of the attenuators 245, 246, depending on the amount of attenuation desired. This common mode voltage $V_{CM}$ from the output of the common mode voltage component 444 is provided as another input selection to a multiplexor 448, and may be selected by the user as another optional output, in addition to $V_A$ and $V_B$. Using the common mode voltage $V_{CM}$ as an input to the multiplier 260 produces a power measurement of an average of the source power and the load power, which may be useful when investigating bidirectional power usage in the DUT. Note that the user may now select between three different power signals to be output from the multiplexor 270—a source power, a load power, and a common mode power, which is the average of the source power and load power. The user selects which specific power signal is produced by the multiplier 260 by making the desired selection using the multiplexor 448.

Figure 5:
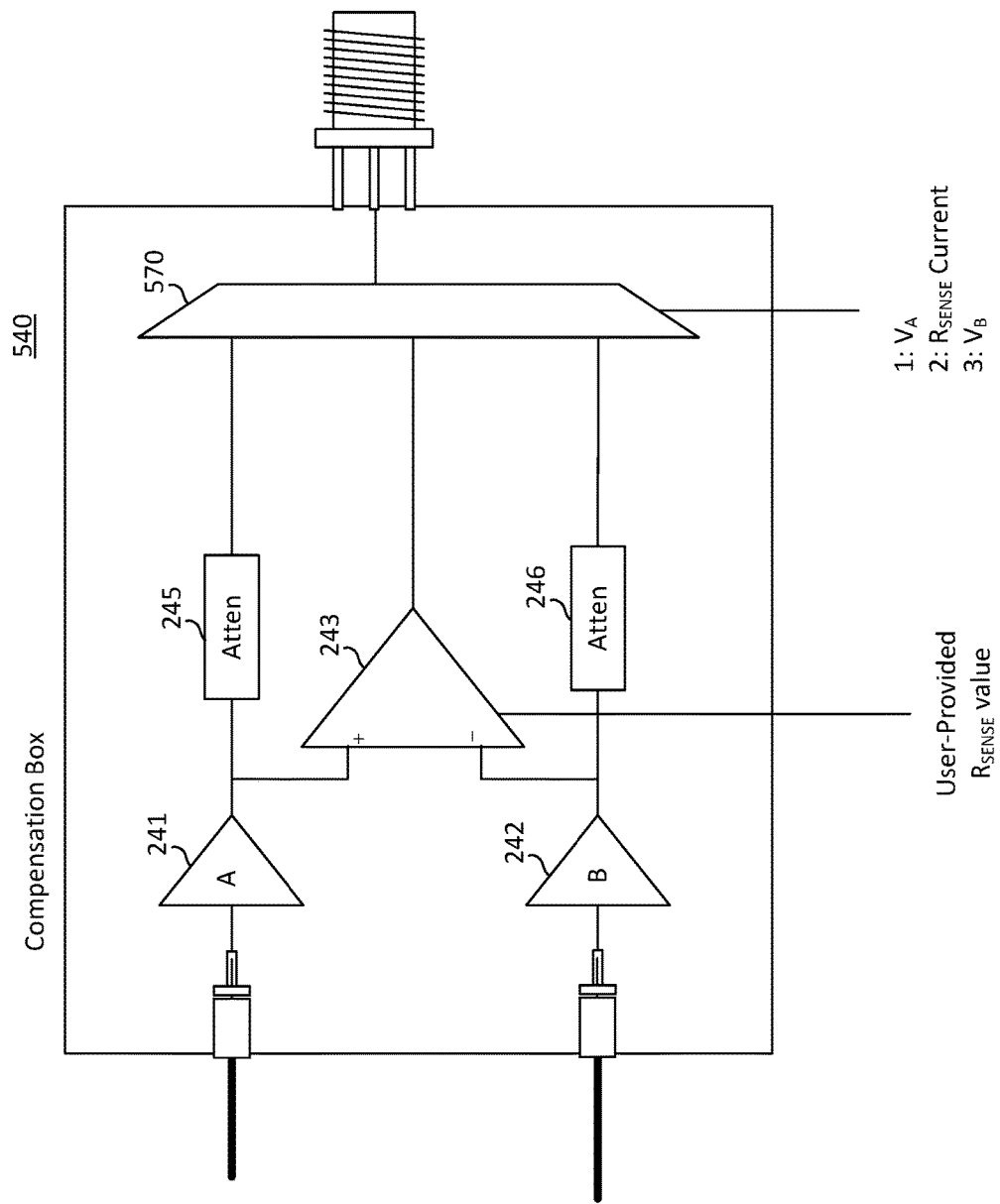
FIG. 5 is a functional block diagram of components of a measurement probe structured to simultaneously provide voltage and current measurements, according to embodiments of the invention.

FIG. 5 is a functional block diagram of components of a measurement probe structured to simultaneously provide voltage and current measurements, according to embodiments of the invention. The compensation box 540 may be used in conjunction with other elements of a measurement probe described above. Compared to the compensation box 240 of FIG. 2, the compensation box 540 illustrated in FIG. 5 has fewer components. Notably, the multiplexor 250 and multiplier 260 are removed, and therefore the power signal output from the multiplier 260 of FIG. 2 is no longer a selection possibility of a multiplexor 570, which determines an output of the compensation box 540. Instead, a measurement probe including components illustrated in the compensation box 540 of FIG. 5 generate signals representing the source voltage $V_A$, the load voltage $V_B$, or the current $I_{RS}$ that is determined by the differential amplifier 243, as described above. A measurement probe made with a compensation box 540 as illustrated in FIG. 5 and a probe tip 220 as illustrated in FIG. 2 is able to output either voltage signals or current signals to a measurement instrument without the necessity of changing any leads of the probe tip. And, as described above, by omitting or bypassing the multiplexor 570 from the compensation box 540, it is possible to simultaneously route source voltage $V_A$, the load voltage $V_B$, and the current $I_{RS}$ to three channels of the instrument simultaneously. Or, if the multiplexor 570 was structured to select between the source voltage $V_A$ and the load voltage $V_B$, and the output from the differential amplifier 243 was routed to its own channel, then the user could select either the source voltage $V_A$ or the load voltage $V_B$, on a first channel, and simultaneously provide the current $I_{RS}$ to the instrument on a different channel.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

EXAMPLES

Illustrative examples of the technologies disclosed herein are provided below. An embodiment of the technologies may include any one or more, and any combination of, the examples described below.

Example 1 is a measurement probe for producing a test signal for a measurement instrument that includes a probe head structured to be connected to at least a first testing point and a second testing point of a Device Under Test (DUT), a current detector in the measurement probe structured to determine a current flowing between the first testing point and the second testing point of the DUT, a first selectable signal path that causes a voltage signal from the first testing point or a voltage signal from the second testing point to be routed to the measurement instrument as a selected voltage test signal; and a second selectable signal path that causes a current signal from an output of the current detector to be routed to the measurement instrument as a selected current test signal.

Example 2 is a measurement probe according to Example 1, in which the selected voltage test signal and the selected current test signal are simultaneously provided to the measurement instrument.

Example 3 is a measurement probe according to any preceding Example, in which a user selects one of the selected voltage test signal and the selected current test signal to be provided to the measurement instrument.

Example 4 is a measurement probe according to Example 3, in which no connection between the probe head and the DUT need be disturbed when switching from the first selectable signal path to the second selectable signal path.

Example 5 is a measurement probe according to any preceding Example, further comprising a power detector in the measurement probe structured to determine an amount of power flowing into or out of a device coupled between the first testing point and the second testing point of the DUT, and a third selectable signal path that causes a power signal from an output of the power detector to be routed to the measurement instrument as a selected power test signal.

Example 6 is a measurement probe according to Example 5, in which the device coupled between the first testing point and the second testing point of the DUT is a shunt resistor.

Example 7 is a measurement probe according to Example 5, in which the power detector is a multiplier structured to multiply an output of the current detector with the voltage signal from the first testing point or the voltage signal from the second testing to produce a power signal.

Example 8 is a measurement probe according to Example 7, in which the power detector is further structured to multiply an output of the current detector with an average of the voltage signal from the first testing point and the voltage signal from the second testing point to produce a common mode power signal.

Example 9 is a measurement probe according to Example 5, further comprising a phase aligner structured to reduce a phase angle misalignment of inputs to the power detector.

Example 10 is a measurement system, comprising a measurement instrument structured to receive a measurement signal, and a probe for producing the measurement signal for the instrument, the measurement probe including a probe head structured to be connected to at least a first testing point and a second testing point of a Device Under Test (DUT), a current detector in the measurement probe structured to determine a current flowing between the first testing point and the second testing point of the DUT, a first selectable signal path that causes a voltage signal from the first testing point or a voltage signal from the second testing point to be routed to the measurement instrument as a selected voltage test signal, and a second selectable signal path that causes a current signal from an output of the current detector to be routed to the measurement instrument as a selected current test signal.

Example 11 is a measurement system according to Example 10, further comprising a power detector in the measurement probe structured to determine an amount of power flowing into or out of a device coupled between the first testing point and the second testing point of the DUT, and a third selectable signal path that causes a power signal from an output of the power detector to be routed to the measurement instrument as a selected power test signal.

Example 12 is a measurement system according to Example 11, in which the device coupled between the first testing point and the second testing point of the DUT is a shunt resistor.

Example 13 is a measurement system according to Example 11, in which the power detector comprises a multiplier structured to multiply an output of the current detector with the voltage signal from the first testing point or the voltage signal from the second testing to produce a power signal.

Example 14 is a measurement system according to Example 11, further comprising a phase aligner structured to reduce a phase angle misalignment of inputs to the power detector.

Example 15 is a method in a measurement probe of generating a signal for testing by a measurement instrument, the measurement probe including a probe head coupled to a first testing point on a voltage source side of a resistor of a DUT, and coupled to a second testing point on a load side of the resistor of the DUT, the method comprising generating a signal indicative of a resistor current flowing through the resistor between the first testing point and the second testing point of the DUT, and routing either the resistor current or a voltage signal from the first testing point or a voltage signal from the second testing point to the measurement instrument as the signal for testing by the measurement instrument.

Example 16 is a method according to Example method 15, further comprising generating a power signal indicative of power flowing into or out of the resistor, and routing either the resistor current, the power signal, or a voltage signal from the first testing point or a voltage signal from the second testing point to the measurement instrument as the signal for testing by the measurement instrument.

Example 17 is a method according to Example method 16, further comprising providing at least one of the voltage signals and the resistor current to the measurement instrument simultaneously.

Example 18 is a method according to Example method 16, further comprising accepting a selection of a desired signal for testing by the measurement instrument from a user, and providing the user-selected signal for testing to the measurement instrument.

Example 19 is a method according to Example method 15, in which generating a signal indicative of the resistor current comprises dividing a sensed voltage from the DUT by a user-supplied resistance value.

Example 20 is a method according to Example method 16, in which generating a power signal comprises multiplying the signal indicative of the resistor current by a voltage signal sensed from the DUT.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A measurement probe for producing a test signal for a measurement instrument, the measurement probe comprising:
   a probe head structured to be connected to at least a first testing point and a second testing point of a Device Under Test (DUT);
   a current detector in the measurement probe structured to determine a current flowing between the first testing point and the second testing point of the DUT;
   a first selectable signal path structured to be capable of providing a voltage signal from each of the first testing point and the second testing point to the measurement instrument, the first selectable signal path causing the voltage signal from one of the first and second test points to be routed to the measurement instrument as a selected voltage test signal; and
   a second selectable signal path that causes a current signal from an output of the current detector to be routed to the measurement instrument as a selected current test signal.

2. The measurement probe according to claim 1, in which the selected voltage test signal and the selected current test signal are simultaneously provided to the measurement instrument.

3. The measurement probe according to claim 1, in which a user selects one of the selected voltage test signal and the selected current test signal to be provided to the measurement instrument.

4. The measurement probe according to claim 3, in which no connection between the probe head and the DUT need be disturbed when switching from the first selectable signal to the second selectable signal.

5. The measurement probe according to claim 1, further comprising:
   a power detector in the measurement probe structured to determine an amount of power flowing into or out of a device coupled between the first testing point and the second testing point of the DUT; and
   a third selectable signal path that causes a power signal from an output of the power detector to be routed to the measurement instrument as a selected current test signal.

6. The measurement probe according to claim 5, in which the device coupled between the first testing point and the second testing point of the DUT is a shunt resistor.

7. The measurement probe according to claim 5, in which the power detector is a multiplier structured to multiply an output of the current detector with the voltage signal from the first testing point or the voltage signal from the second testing to produce a power signal.

8. The measurement probe according to claim 7, in which the power detector is further structured to multiply an output of the current detector with an average of the voltage signal from the first testing point and the voltage signal from the second testing point to produce a common mode power signal.

9. The measurement probe according to claim 5, further comprising a phase aligner structured to reduce a phase angle misalignment of inputs to the power detector.

10. A measurement system, comprising:
    a measurement instrument structured to receive a measurement signal; and a probe for producing the measurement signal for the instrument, the measurement probe including:
  a probe head structured to be connected to at least a first testing point and a second testing point of a Device Under Test (DUT),
  a current detector in the measurement probe structured to determine a current flowing between the first testing point and the second testing point of the DUT;
  a first selectable signal path structured to be capable of providing a voltage signal from each of the first testing point and the second testing point to the measurement instrument, the first selectable signal path causing the voltage signal from one of the first and second test points to be routed to the measurement instrument as a selected voltage test signal; and
  a second selectable signal path that causes a current signal from an output of the current detector to be routed to the measurement instrument as a selected current test signal.

11. The measurement system according to claim 10, further comprising:
  a power detector in the measurement probe structured to determine an amount of power flowing into or out of a device coupled between the first testing point and the second testing point of the DUT; and
  a third selectable signal path that causes a power signal from an output of the power detector to be routed to the measurement instrument as a selected current test signal.

12. The measurement system according to claim 11, in which the device coupled between the first testing point and the second testing point of the DUT is a shunt resistor.

13. The measurement system according to claim 11, in which the power detector comprises a multiplier structured to multiply an output of the current detector with the voltage signal from the first testing point or the voltage signal from the second testing to produce a power signal.

14. The measurement system according to claim 11, further comprising a phase aligner structured to reduce a phase angle misalignment of inputs to the power detector.

15. A method in a measurement probe of generating a signal for testing by a measurement instrument, the measurement probe including a probe head coupled to a first testing point on a voltage source side of a resistor of a DUT, and coupled to a second testing point on a load side of the resistor of the DUT, the method comprising:
  generating a signal indicative of a resistor current flowing through the resistor between the first testing point and the second testing point of the DUT;
  selecting the signal indicative of the resistor current flowing through the resistor as a first selected test signal;
  routing the first selected test signal to the measurement instrument as the signal for testing by the measurement instrument;
  selecting a voltage signal from the first testing point;
  routing the selected voltage signal from the first testing point to the measurement instrument as the signal for testing by the measurement instrument;
  selecting a voltage signal from the second testing point; and
  routing the selected voltage signal from the second testing point to the measurement instrument as the signal for testing by the measurement instrument.

16. The method according to claim 15, further comprising:
  generating a power signal indicative of power flowing into or out of the resistor; and
  routing either the resistor current, the power signal, the voltage signal from the first testing point, or the voltage signal from the second testing point to the measurement instrument as the signal for testing by the measurement instrument.

17. The method according to claim 16, further comprising providing at least one of the voltage signals and the resistor current to the measurement instrument simultaneously.

18. The method according to claim 16, further comprising:
  accepting a selection of a desired signal for testing by the measurement instrument from a user; and
  providing the user-selected signal for testing to the measurement instrument.

19. The method according to claim 15 in which generating a signal indicative of the resistor current comprises dividing a sensed voltage from the DUT by a user-supplied resistance value.

20. The method according to claim 16 in which generating a power signal comprises multiplying the signal indicative of the resistor current by a voltage signal sensed from the DUT.

* * * * *